United States Patent
Tomida

(10) Patent No.: US 9,576,832 B2
(45) Date of Patent: Feb. 21, 2017

(54) ARTICLE TRANSPORT VEHICLE WITH DAMPER ELEMENT

(71) Applicant: Daifuku Co., Ltd., Osaka-shi (JP)

(72) Inventor: Daichi Tomida, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 14/937,039

(22) Filed: Nov. 10, 2015

(65) Prior Publication Data

US 2016/0133488 A1    May 12, 2016

(30) Foreign Application Priority Data

Nov. 12, 2014 (JP) .................................. 2014-230060

(51) Int. Cl.
*H01L 21/677* (2006.01)
*B66C 11/04* (2006.01)

(52) U.S. Cl.
CPC .......... *H01L 21/6773* (2013.01); *B66C 11/04* (2013.01); *H01L 21/67733* (2013.01)

(58) Field of Classification Search
CPC ................................................ H01L 21/67733
See application file for complete search history.

(56) References Cited

U.S. PATENT DOCUMENTS

| 4,852,928 A * | 8/1989 | Monforte | B25J 13/082 901/47 |
| 6,592,324 B2 * | 7/2003 | Downs | B25J 15/0253 414/730 |
| 7,887,108 B1 * | 2/2011 | Cawley | B25J 15/022 414/731 |
| 2006/0018749 A1 * | 1/2006 | Kwon | B65G 49/061 414/806 |
| 2006/0180565 A1 * | 8/2006 | Nakao | B66C 13/06 212/332 |
| 2012/0118845 A1 * | 5/2012 | Wada | H01L 21/67733 212/71 |
| 2015/0197412 A1 * | 7/2015 | Tomida | H01L 21/67733 212/273 |
| 2015/0336279 A1 * | 11/2015 | Usami | H01L 21/67733 294/67.33 |
| 2015/0336280 A1 * | 11/2015 | Usami | H01L 21/67733 294/67.33 |

FOREIGN PATENT DOCUMENTS

JP    2006298535 A    11/2006

* cited by examiner

*Primary Examiner* — Gerald McClain
(74) *Attorney, Agent, or Firm* — The Webb Law Firm

(57) ABSTRACT

An article transport vehicle is provided in which it is difficult for the transported article support portions to interfere with the supported portion of the transported article while reducing transmission of vibrations to the transported article, during a travel of the travel member or during a vertical movement of the vertically movable portion. A support unit which is vertically moved relative to a travel member is provided with a guiding supporting portion for guiding and supporting transported article support portions for supporting a supported portion of a transported article such that the transported article support portions can be moved to support positions and to retracted positions, and a damper element which is located between a vertically movable portion and the guiding supporting portion and receives load from the guiding supporting portion and which is elastically deformable in a vertical direction.

8 Claims, 3 Drawing Sheets

ARTICLE TRANSPORT VEHICLE WITH DAMPER ELEMENT

CROSS-REFERENCE TO RELATED APPLICATION

This application claims priority to Japanese Patent Application No. 2014-230060 filed Nov. 12, 2014, the disclosure of which is hereby incorporated in its entirety by reference.

FIELD OF THE INVENTION

The present invention relates to an article transport vehicle which suspends and supports a transported article with a support unit to transport the transported article.

BACKGROUND ART

An example of an article transport vehicle which transports a transported article with the article suspended and supported thereby is disclosed in JP Publication of Application No. 2006-298535 (Patent Document 1). This article transport vehicle includes a travel member which travels along a travel path, a support unit which suspends and supports the transported article, and a vertical movement actuator which vertically moves the support unit with respect to the travel member. The support unit includes a vertically movable portion which is moved vertically by the vertical movement actuator, transported article support portions which supports a supported portion of the transported article, and a support actuator which moves the transported article support portions to support positions in which the transported article support portions are located directly below the supported portion and to retracted positions in which the transported article support portions are retracted from their positions directly below the supported portion. In addition, the support unit includes guiding supports which guide and support the transported article support portions such that the transported article support portions can be moved between the support positions and the retracted positions. And damper elements which are elastically deformable in the vertical direction are provided on the top surfaces of the transported article support portions.

The damper elements provided to the top surfaces of the transported article support portions receive the load of the supported transported article. In other words, in the article transport vehicle of Patent Document 1, transmission of vibration to the transported article, during a travel of the travel member or during a vertical movement of the vertically movable portion, is reduced by interposing the damper elements between the transported article support portions and the supported portion of the transported article. However, the thickness, or the vertical dimension, of the transported article support portions increases by providing such damper elements on the top surfaces of the transported article support portions. Thus, it becomes more likely for the transported article support portions to interfere with the supported portion of the transported article when the transported article support portions are moved from the retracted positions to the support positions in order to support the supported portion of the transported article with the transported article support portions.

SUMMARY OF THE INVENTION

Problems to be Solved by the Invention

To this end, an article transport vehicle is desired in which it is difficult for the transported article support portions to interfere with the supported portion of the transported article while reducing transmission of vibration to the transported article, during a travel of the travel member or during a vertical movement of the vertically movable portion.

Means for Solving the Problems

An article transport vehicle in accordance with an embodiment conceived in light of the points discussed above comprises a travel member configured to travel along a travel path; a support unit for suspending and supporting a transported article; a vertical movement actuator for vertically moving the support unit relative to the travel member;

wherein the support unit includes a vertically movable portion which is vertically moved by the vertical movement actuator, transported article support portions for supporting a supported portion of the transported article, one or more support actuators for moving the transported article support portions between support positions and retracted positions, wherein the support positions are positions in which the transported article support portions are located directly below the supported portion, and the retracted positions are positions in which the transported article support portions are retracted from directly below the supported portion, wherein the support unit further includes a guiding supporting portion that supports the transported article support portions and movably guides the transported article support portions to the support positions and to the retracted positions, and a damper element which is disposed between the vertically movable portion and the guiding supporting portion and receives load from the guiding supporting portion including load from the transported article support portions, and which is elastically deformable in a vertical direction.

With the arrangement described above, because the damper element is located between the vertically movable portion and the guiding supporting portion which supports the transported article support portions, vibration of the vertically movable portion during a travel of the travel member and vibrations of the vertically movable portion during a vertical movement of the vertically movable portion are absorbed by the damper element; thus, any vibration which may be transmitted to the transported article supported by the transported article support portions can be reduced. Also, the damper element is located between the vertically movable portion and the guiding supporting portion and not on the top surfaces of the transported article support portions as in, for example, Patent Document 1. As a result, the thickness, or the vertical dimension, of the transported article support portions can be made small compared with the case where damper elements are provided on the top surfaces of the transported article support portions. Thus, it can be made difficult, or less likely, for the transported article support portions to interfere with the supported portion of the transported article when the transported article support portions are moved from the retracted positions to the support positions in order to support the supported portion of the transported article with the transported article support portions. In other words, by providing the damper element between the vertically movable portion and the guiding supporting portion such that the damper element receives the load from the guiding supporting portion, it can be made difficult, or less likely, for the transported article support portions to interfere with the supported portion of the transported article while reducing transmission of vibration to the transported article, during a travel of the travel member or during a vertical movement of the vertically movable portion.

Additional features and advantages of the article transport facility will become clear from the following description about the embodiments described with reference to the drawings.

DETAILED DESCRIPTION

Figure 1:
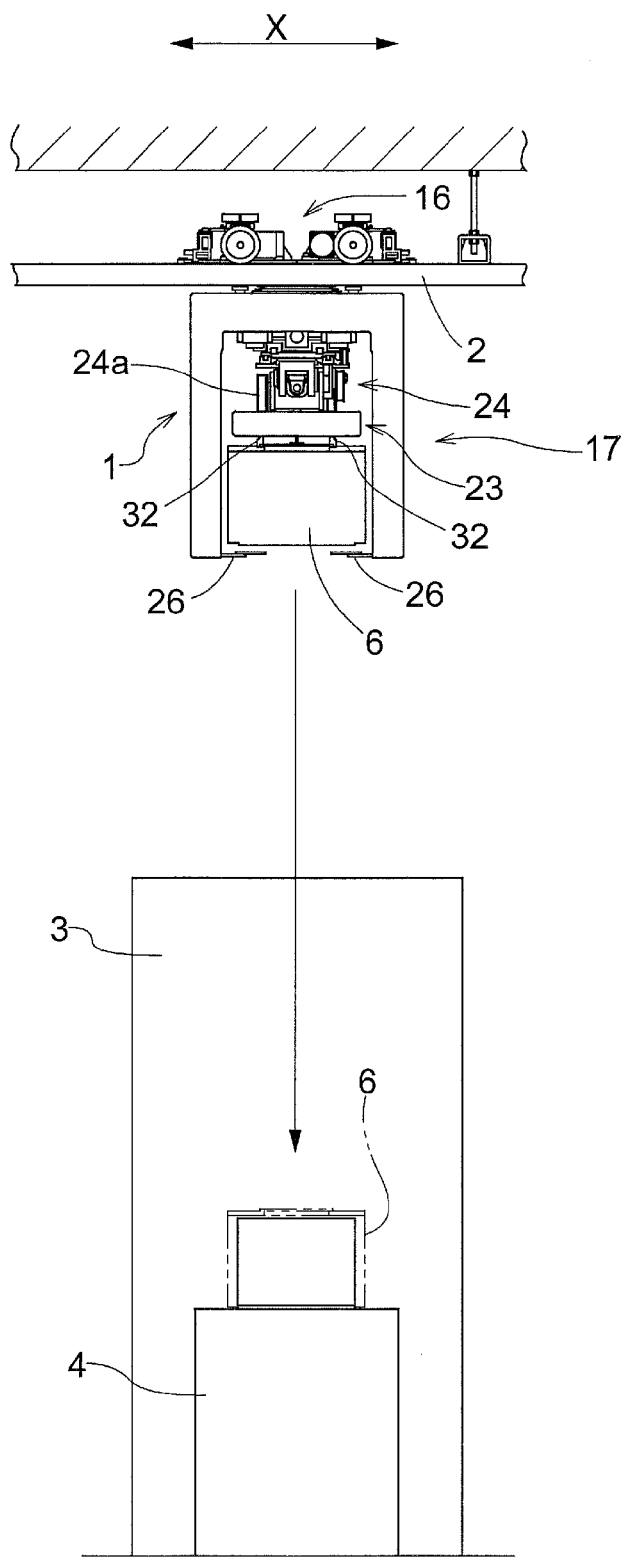
FIG. 1 is a side view of an article transport facility.

Embodiments in which an article transport vehicle is incorporated into an article transport facility are described next with reference to the drawings. As shown in FIG. 1, the article transport facility includes a ceiling, or an overhead, transport vehicle 1 which is guided and supported by travel rails 2 provided along a travel path on the ceiling side and which functions as an article transport vehicle which can travel along the travel path, a processing device 3 which processes substrates held in, or carried by, the transported article 6, and a support platform 4 installed on the floor and next to the processing device 3. The transported articles 6 which are transported by the ceiling transport vehicle 1 are transporting containers for holding objects held therein, and are more specifically FOUPs (Front Opening Unified Pod) each of which hold a plurality of semiconductor substrates as objects or articles held therein.

[Transported Article]

Figure 3:
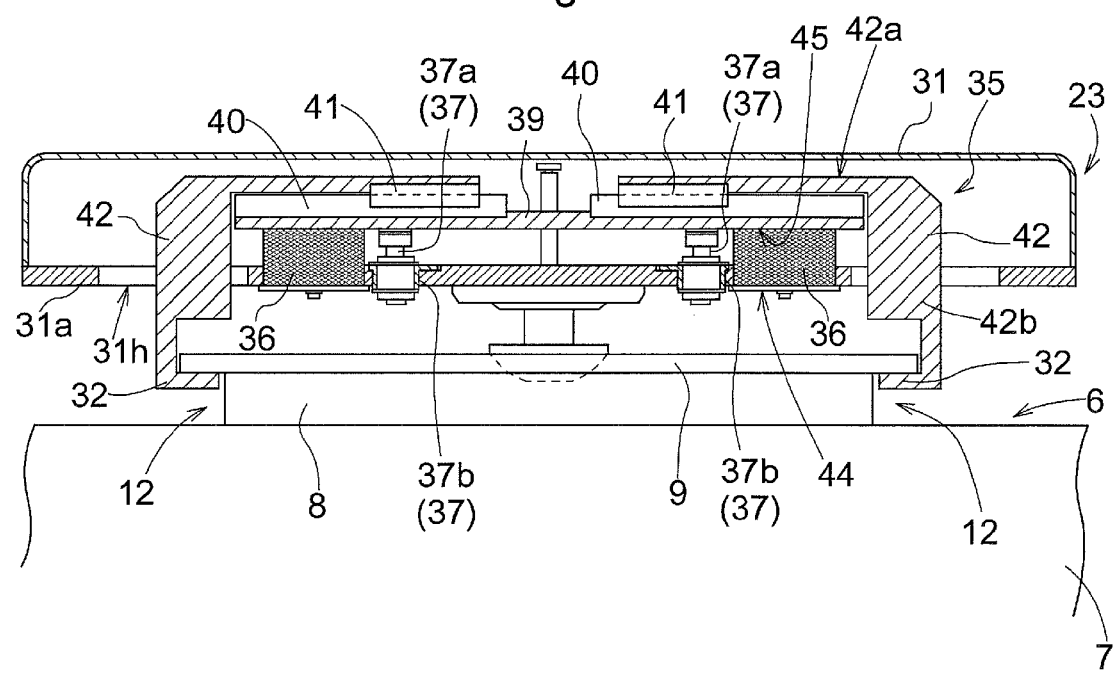
FIG. 3 is a vertical sectional side view of a support mechanism when a pair of transported article support portions are in support positions.

As shown in FIG. 3, the transported article 6 includes a main body portion 7 for holding a plurality of substrates, a supported portion 9 (flange portion) which is located above this main body portion 7 and is provided in an upper end portion of the transported article 6, a connecting portion 8 which connects the main body portion 7 to the supported portion 9, and a detachable lid (not shown) for closing an opening, which is formed in a front face of the main body portion 7, for inserting and removing the substrates. The supported portion 9 is formed to have a shape that projects from the connecting portion 8 along a container fore and aft direction and also along a container lateral, or right and left, direction. And inserting space 12 (space for inserting transported article support portions) is formed between the top surface of the main body portion 7 and the undersurface of the supported portion 9. Thus, the inserting space 12 is formed below the supported portion 9 of the transported article 6. This inserting space 12 is the space into which a pair of transported article support portions 32, described below, are inserted along the container lateral direction.

[Ceiling Transport Vehicle]

The ceiling, or overhead, transport vehicle 1 is described next. In the description, the direction along the travel direction of the ceiling transport vehicle 1 will be referred to as the fore and aft direction X whereas the (horizontal) direction that perpendicularly intersects the fore and aft direction X in plan view will be referred to as the lateral, or right and left, direction Y. In addition, the transported article 6 is supported by the vertical movement support portion 17 such that the container lateral direction of the transported article 6 is parallel to the fore and aft direction X of the ceiling transport vehicle 1. Accordingly, in the description below, the transported article 6 will be assumed to be supported by the vertical movement support portion 17 so that the container lateral direction of the transported article 6 coincides with the fore and aft direction X whereas the container fore and aft direction of the transported article 6 coincides with the lateral direction Y.

Figure 2:
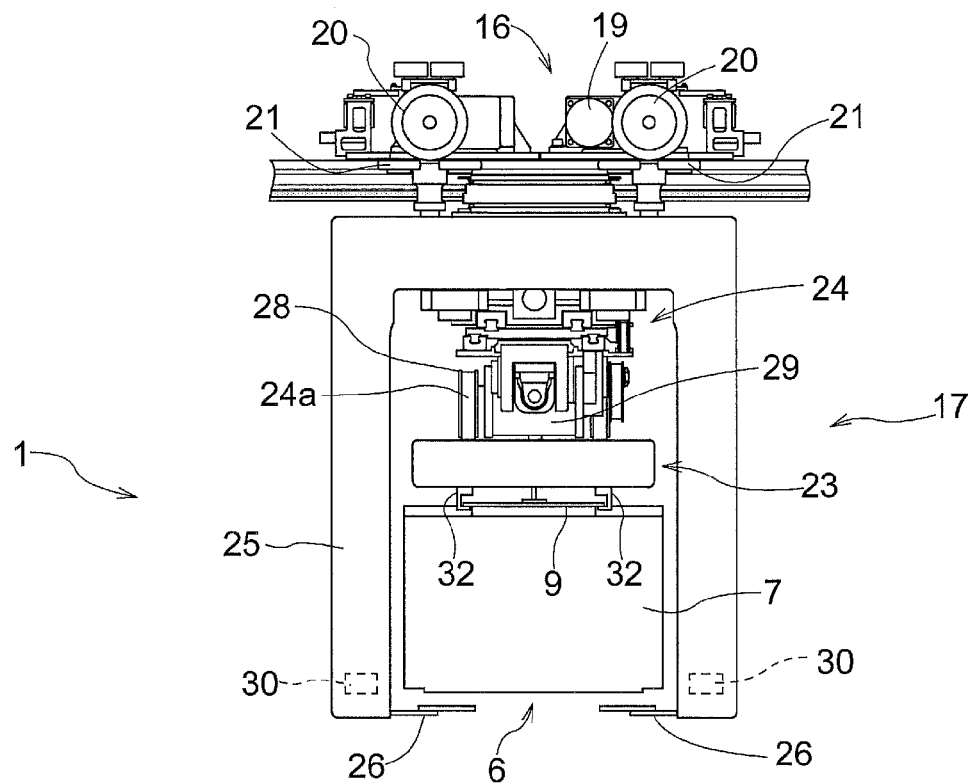
FIG. 2 is a side view of a ceiling transport vehicle.

As shown in FIGS. 1 and 2, the ceiling transport vehicle 1 includes a travel portion 16 which travels on the travel rails 2 along the travel path, and the vertical movement support portion 17 which is suspended and supported by the travel portion 16 such that the vertical movement support portion 17 is located below the travel rails 2, and which supports the support mechanism 23 which, in turn, supports the transported article 6, such that the support mechanism 23 can be raised or lowered, or vertically moved. Note that the travel portion 16 is, or corresponds to, the travel member which travels along the travel path, and the support mechanism 23 is, or corresponds to, the support unit which suspends and supports the transported article 6.

As shown in FIG. 2, the travel portion 16 includes drive wheels 20 which are driven and rotated by a travel motor 19 to roll on the top surfaces of the travel rails 2, and guide wheels 21 which are freely rotatable and in contact with the side faces of the travel rails 2. The travel portion 16 travels along the travel path by the virtue of the fact that the drive wheels 20 are driven and rotated by the travel motor 19, and of the fact that the guide wheels 21 are contacted and thus guided by the travel rails 2.

The vertical movement support portion 17 includes the above-described support mechanism 23 which suspends and supports the transported article 6, the vertically moving mechanism 24 for raising and lowering, or vertically moving, the support mechanism 23, a cover portion 25 for covering an area above, and areas forward and rearward, along the fore and aft direction X, of the transported article 6 supported by the support mechanism 23 and located at a support height (see FIGS. 2 and 3), and fall prevention members 26 for preventing a fall of the transported article 6 supported by the support mechanism 23 at the support height.

The vertically moving mechanism 24 includes spooling members 28 for spooling and feeding out spool belts 24a whose respective distal end portions are connected to the support mechanism 23, and a vertical movement motor 29 for drivingly rotating the spooling members 28. The support mechanism 23 is vertically moved with respect to the travel portion 16 by the virtue of the fact that the spooling members 28 are driven and rotated in a forward direction and in an opposite direction by the vertical movement motor 29 to spool and feed out the spool belts 24a. Note that the vertical movement motor 29 is, or corresponds to, the vertical movement actuator.

The vertically moving mechanism 24 includes a pair of transported article support portions 32 for supporting from below both end portions, along the fore and aft direction X, of the supported portion 9 of the transported article 6. By driving and rotating the spooling members 28 in a forward direction or in an opposite direction by the vertical movement motor 29 to vertically move the support mechanism 23 as described above, the pair of transported article support portions 32 are vertically moved between a raised height and a lowered height which is lower than the support height. When the pair of transported article support portions 32 are at the raised height, the transported article 6 supported by the pair of the transported article support portions 32 is located at the support height, as shown with solid lines in FIG. 1.

And when the pair of transported article support portions 32 are at the lowered height, the transported article 6 is located at a transfer height (or a height for transferring), as shown with dashed lines in FIG. 1.

In other words, as the vertically moving mechanism 24 spools the spool belts 24a to cause the pair of transported article support portions 32 to be raised to the raised height, the transported article 6 supported by the support mechanism 23 is raised to the support height (see FIGS. 1 and 2). On the other hand, as the vertically moving mechanism 24 feeds out the spool belts 24a to cause the pair of transported article support portions 32 to be lowered to the lowered height, the transported article 6 supported by the support mechanism 23 is lowered to the transfer height (see FIG. 1).

As shown in FIGS. 1 and 2, one pair of fall prevention members 26 is provided such that the fall prevention members 26 are spaced apart from each other in the fore and aft direction X. The fall prevention members 26 are configured in a way that allows their positions to be changed such that the distance between the pair of fall prevention members 26 can be changed between a receiving distance which is narrower, or less, than the width of the transported article 6 in the fore and aft direction X (see FIGS. 1 and 2) and a retraction distance (not shown) which is broader, or greater, than the width of the transported article 6 in the fore and aft direction X. The distance between the pair of fall prevention members 26 is changed through actuation of a fall prevention motor 30. By bringing the distance between the pair of fall prevention members 26 to the receiving distance, the transported article 6 is received by the fall prevention members 26 and thus can be prevented from falling to the floor even if the support of the transported article 6 by the support mechanism 23 is disengaged during a travel of the ceiling transport vehicle 1. And by bringing the distance between the pair of fall prevention members 26 to the retraction distance, the support mechanism 23 can be vertically moved to unload the transported article 6 onto the support platform 4 or to receive the transported article 6 from the support platform 4.

[Support Mechanism]

Figure 4:
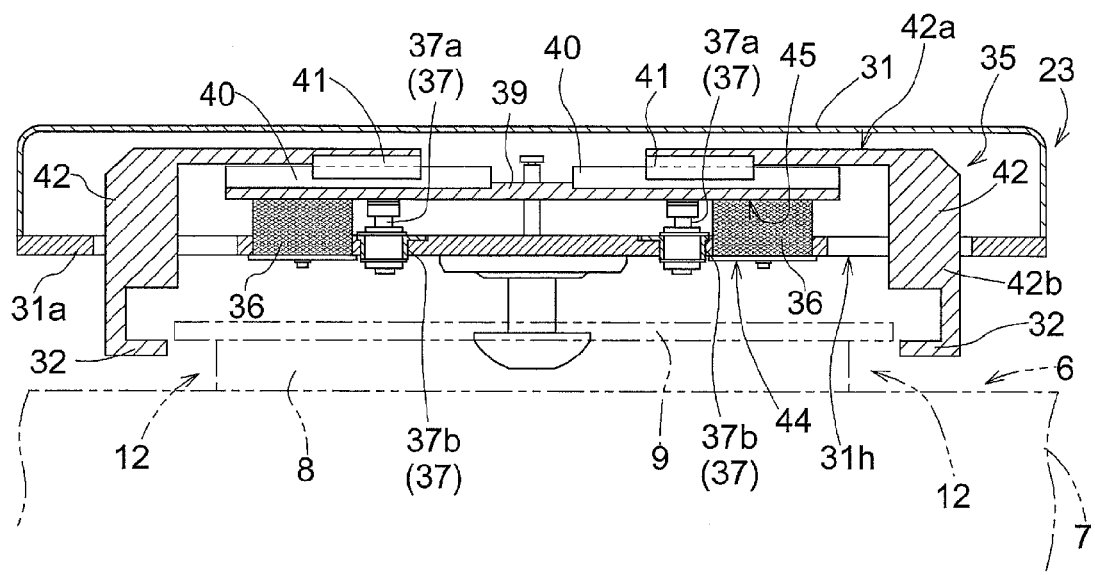
FIG. 4 is a vertical sectional side view of the support mechanism when the pair of transported article support portions are in retracted positions.
Figure 5:
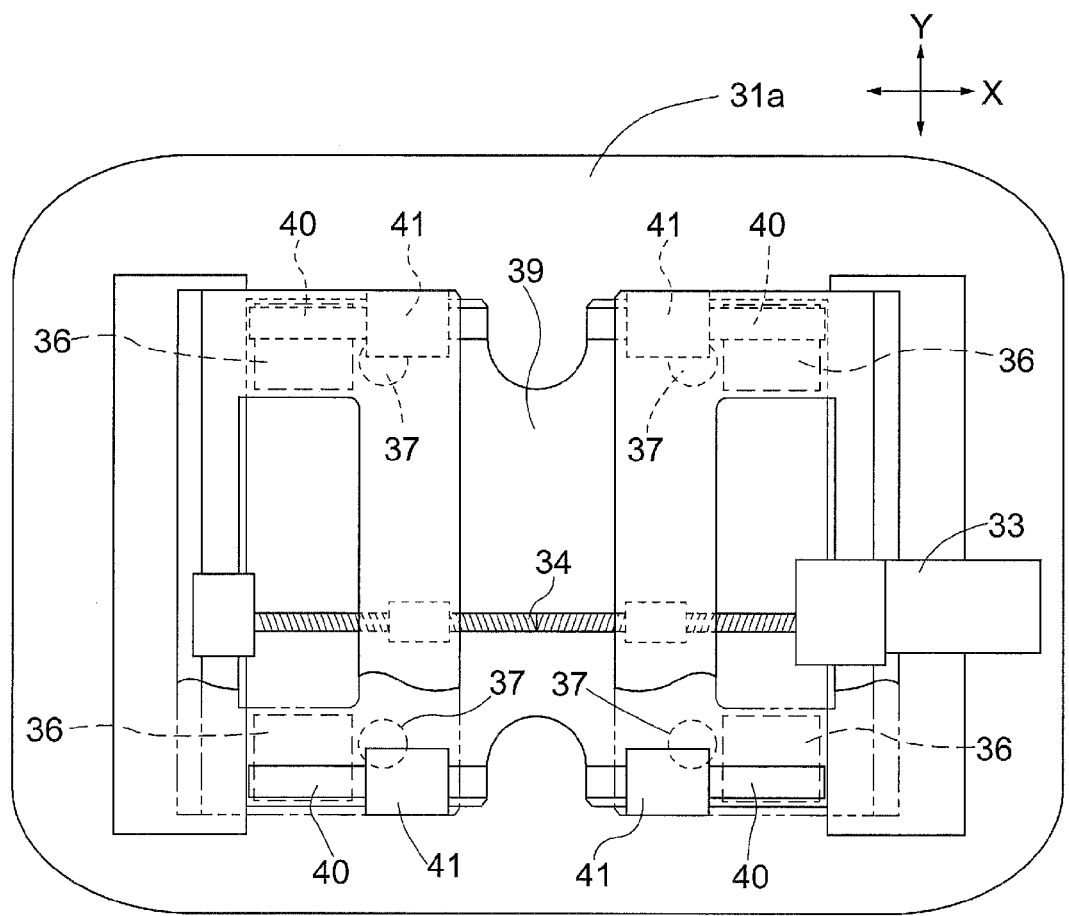
FIG. 5 is a plan view of the support mechanism.

As shown in FIGS. 3-5, the support mechanism 23 of the ceiling transport vehicle 1 includes the vertically movable member 31 which functions as a vertically movable portion and which is connected to the distal end portions of the spool belts 24a, and is vertically moved by the vertically moving mechanism 24, the transported article support portions 32 for supporting the supported portion 9 of the transported article 6, and a support motor 33 for horizontally moving the transported article support portions 32. The transported article support portions 32 are horizontally moved by the actuating force of the support motor 33 when the transported article support portion 32 is at the lowered height and the article is located on the support platform 4. This causes the transported article support portions 32 to be moved between support positions in which the transported article support portions 32 are located directly below the supported portion 9 (see FIG. 3) and retracted positions in which the transported article support portions 32 are retracted from the positions directly below the supported portion 9 (see FIG. 4). In other words, the support motor 33 is, or corresponds to, the support actuator. The vertically movable member 31 is formed to have a box shape. And a guiding supporting portion 35 and the support motor 33 which are connected to the transported article support portions 32 are installed within the vertically movable member 31. As shown in FIGS. 3 and 4, the transported article support portions 32 are connected to the guiding supporting portion 35 such that the transported article support portions project downwardly from respective holes 31h formed in the bottom face 31a of the box-shaped vertically movable member 31.

The pair of transported article support portions 32 are arranged such that they can be moved toward and away from each other along the fore and aft direction X. And the distance between the pair of transported article support portions 32 is changed between a support distance and a retraction distance by moving the pair of transported article support portions 32 toward and away from each other along the fore and aft direction X through actuation of the support motor 33. The support distance is one in which the distance between the pair of transported article support portions 32 in the fore and aft direction X is narrower, or less, than the width of the supported portion 9 of the transported article 6 in the fore and aft direction X. And the retraction distance is one in which the distance between the pair of transported article support portions 32 in the fore and aft direction X is broader, or greater, than the width of the supported portion 9 of the transported article 6 in the fore and aft direction X.

Thus, by changing the distance between the pair of transported article support portions 32 to the support distance as shown in FIG. 3 with the pair of transported article support portions 32 lowered to the transfer height, each of the pair of transported article support portions 32 is inserted into the inserting space 12 of the transported article 6 located at a transfer location, and is thus moved to its support position directly below the supported portion 9. Also, by changing the distance between the pair of transported article support portions 32 to the retraction distance as shown in FIG. 4 with the pair of transported article support portions 32 lowered to the transfer height, each of the pair of transported article support portions 32 is moved out of the inserting space 12 of the transported article 6 located at a transfer location, and is thus moved to its retraction position in which the article support portion 32 is retracted from the position directly below the supported portion 9.

As shown in FIGS. 3-5, the support mechanism 23 includes the guiding supporting portion 35 for guiding and supporting the transported article support portions 32 for movement between the support positions and the retracted positions, damper elements 36 which are elastically deformable in the vertical direction and are located between the vertically movable member 31 and the guiding supporting portion 35 to bear, or receive, the load from (or downward force exerted by) the guiding supporting portion 35, and horizontal restriction members 37 for restricting or preventing horizontal movement of the guiding supporting portion 35 relative to the vertically movable member 31. Each damper element 36 is an elastic member, such as a member made of rubber. And the guiding supporting portion 35 and the damper elements 36 are installed within the vertically movable member 31.

The guiding supporting portion 35 includes a base frame 39, linear rails 40 provided on the base frame 39 to extend along the fore and aft direction X, guide members 41 which are guided along and supported by the linear rails 40 for movement along the fore and aft direction X, and connecting members 42 which connect the transported article support portions 32 to the guide members 41. A pair of connecting members 42 are spaced apart from each other in the fore and aft direction X to correspond to the respective transported article support portions 32. And the guide members 41 for guiding the transported article support portion 32 that corresponds to each of the pair of connecting members 42 are supported by the corresponding connecting member 42. Each connecting member 42 includes a shoulder portion 42a which is connected to each of the corresponding guide members 41 and extends horizontally, and an upper arm portion 42b which is bent downward from the shoulder portion 42a and is connected to the transported article support portion 32. In other words, the transported article support portions 32, used as arms for grasping or holding the transported article 6, are formed to be continuous with respective upper arm portions 42b by cutting out a piece from each of the upper arm portions 42b that face each other.

As described above, the vertically movable member 31 is formed to have a box shape, and contains within it at least a part of the guiding supporting portion 35. In the present embodiment, the box-shaped vertically movable member 31 contains within it the base frame 39, the linear rails 40, the guide members 41, the shoulder portions 42a, and at least a part of the upper arm portions 42b. Holes 31h are formed in the bottom face portion 31a of the vertically movable member 31. And a part of each upper arm portion 42b and the transported article support portions 32 project downwardly from the holes 31h. Therefore, the transported article 6 is supported by the transported article support portions 32 below the box-shaped vertically movable member 31.

In addition, as shown in FIG. 5, the guiding supporting portion 35 includes a ball screw 34 meshed, or in threading engagement, with the connecting members 42, and the support motor 33 which drivingly rotates the ball screw 34. As the ball screw 34 is drivingly rotated by the support motor 33, the pair of transported article support portions 32 are moved closer to or away from each other along the fore and aft direction X while the guide members 41 are being guided by the linear rails 40. This arrangement allows the distance between the pair of transported article support portions 32 to be changed between the support distance and the retraction distance.

Each horizontal restriction member 37 includes a linear shaft 37a connected to the base frame 39, and a linear bush 37b connected to the bottom face portion 31a of the vertically movable member 31. The linear shaft 37a is fitted into the linear bush 37b for movement along the vertical direction. In addition, the lower end portion of the linear shaft 37a contacts the linear bush 37b to prevent the linear shaft 37a from slipping upwardly out of the linear bush 37b. The horizontal restriction members 37 connect the base frame 39 to the bottom face portion 31a of the vertically movable member 31. The horizontal restriction members 37 restrict or prevent the base frame 39 from moving upwardly and away from the bottom face portion 31a by more than a set distance, and also restrict or prevent the base frame 39 from moving horizontally relative to the bottom face portion 31a.

Receiving portions 44, each of which receives and supports a damper element 36, are provided to the bottom face portion 31a of the vertically movable member 31. And received portions 45, each of which is located above or upwardly of the corresponding receiving portion 44 and is received and supported by respective damper elements 36, are provided to the base frame 39 of the guiding supporting portion 35. Each damper element 36 is disposed between the receiving portion 44 of the bottom face portion 31a and the received portion 45 of the base frame 39, and is in a compressed state from receiving the load from (or downward force exerted by) the guiding supporting portion 35, etc.

Each damper element 36 is connected only to the receiving portion 44 among the receiving portion 44 and the received portion 45. In addition, these receiving portions 44 are removably provided to the vertically movable member 31 so that the damper elements 36 can be removed from the support mechanism 23 together with the receiving portions 44 by removing the receiving portions 44 from the support mechanism 23.

As described above, by providing the damper elements 36, which are elastically deformable in the vertical direction, between the vertically movable member 31 and the guiding supporting portion 35, the transported article support portions 32 are formed to be thin, or have a small dimension, in the vertical direction, thus making it difficult, or less likely, for the transported article support portions 32 to interfere with the supported portion 9 of the transported article 6 while reducing vibration that may occur during a travel of the travel portion 16 and vibration that may occur during a vertical movement of the vertically movable member 31, and that are transmitted to the transported article 6.

Alternative Embodiments (1) In the embodiment described above, the damper elements 36 and the horizontal restriction members 37 are provided to reduce vertical vibrations transmitted to the transported article support portions 32. However, vertical and horizontal vibration transmitted to the transported article support portions 32 may be reduced by providing only the damper elements 36.

(2) In addition, although each horizontal restriction member 37 include a linear shaft 37a and a linear bush 37b, the configuration of the horizontal restriction members 37 may be changed suitably or as necessary. For example, the horizontal restriction members 37 may be formed as restriction members that project vertically from the bottom face portion 31a such that they are located to either side of and in contact with the base frame 39 so that any horizontal movement of the guiding supporting portion 35 relative to the vertically movable member 31 is prevented because the base frame 39 is in contact with the restricting members 39.

(3) In the embodiment described above, the damper elements 36 are provided in the compressed state; however, the damper elements 36 may be provided in an expanded state. For example, the damper elements 36 may be provided in the expanded state by means of upper connection portions provided to the vertically movable member 31 and connected to upper portions of the damper elements 36, and lower connection portions provided to the guiding supporting portion 35 and located below corresponding upper connection portions and connected to the lower portions of the damper elements 36.

(4) Also, in the embodiment described above, each damper element 36 is of rubber material; however, the damper element 36 may be other elastic member, such as a coil spring. The damper element 36 may also be an attenuation, or damping, device, such as a shock absorber.

(5) In the embodiment described above, the receiving portions 44 are arranged to be removable from the vertically movable member 31 so that maintenance can be performed on the damper element 36 from an opening created by removing the receiving portion 44. However, a lid which can be opened and closed may be provided to a side face portion of the vertically movable member 31 so that maintenance can be performed on the damper element 36 through an opening made available by opening the lid.

(6) In the embodiment described above, the article transport vehicle is a ceiling, or overhead, transport vehicle 1 having the vertical movement support portion below the travel rails 2. However, the article transport vehicle may be a ceiling, or overhead, transport vehicle 1 having the vertical movement support portion above the travel rails 2. In addition, the article transport vehicle may be a on-floor transport vehicle which travels on the floor or on travel rails 2 installed on the floor.

Next, a brief summary is provided of the article transport facility described above.

An article transport vehicle in accordance with an embodiment conceived in light of the points discussed above comprises a travel member configured to travel along a travel path; a support unit for suspending and supporting a transported article; a vertical movement actuator for vertically moving the support unit relative to the travel member;

wherein the support unit includes a vertically movable portion which is vertically moved by the vertical movement actuator, transported article support portions for supporting a supported portion of the transported article, one or more support actuators for moving the transported article support portions between support positions and retracted positions, wherein the support positions are positions in which the transported article support portions are located directly below the supported portion, and the retracted positions are positions in which the transported article support portions are retracted from directly below the supported portion, and wherein the support unit further includes a guiding supporting portion that supports the transported article support portions and movably guides the transported article support portions to the support positions and to the retracted positions, and a damper element which is disposed between the vertically movable portion and the guiding supporting portion and receives load from the guiding supporting portion including load from the transported article support portions, and which is elastically deformable in a vertical direction.

With the arrangement described above, because the damper element is located between the vertically movable portion and the guiding supporting portion which supports the transported article support portions, vibration of the vertically movable portion during a travel of the travel member and vibrations of the vertically movable portion during a vertical movement of the vertically movable portion are absorbed by the damper element; thus, any vibration which may be transmitted to the transported article supported by the transported article support portions can be reduced. Also, the damper element is located between the vertically movable portion and the guiding supporting portion and not on the top surfaces of the transported article support portions as in, for example, Patent Document 1. As a result, the thickness, or the vertical dimension, of the transported article support portions can be made small compared with the case where damper elements are provided on the top surfaces of the transported article support portions. Thus, it can be made difficult, or less likely, for the transported article support portions to interfere with the supported portion of the transported article when the transported article support portions are moved from the retracted positions to the support positions in order to support the supported portion of the transported article with the transported article support portions. In other words, by providing the damper element between the vertically movable portion and the guiding supporting portion such that the damper element receives the load from the guiding supporting portion, it can be made difficult, or less likely, for the transported article support portions to interfere with the supported portion of the transported article while reducing transmission of vibration to the transported article, during a travel of the travel member or during a vertical movement of the vertically movable portion.

It would be preferable if the transport vehicle further comprises a horizontal restriction member which restricts a horizontal movement of the guiding supporting portion relative to the vertically movable portion.

With the arrangement described above, because the horizontal restriction member restricts horizontal movement of the guiding supporting portion relative to the vertically movable portion, it is difficult for the guiding supporting portion, the transported article support portions, and an article supported by the guiding supporting portions to move horizontally when vertically moving the vertically movable portion to transfer the article, which makes it easy to transfer the article to a proper position by the vertical movement of the vertically movable portion.

In addition, the vertically movable portion is preferably provided with the receiving portion which receives and supports the damper element, wherein the guiding supporting portion is preferably provided with the received portion which is located above the receiving portion and is received and supported by the damper element, and wherein the transported article support portions are preferably located below the vertically movable portion. For example, in one embodiment, the guiding supporting portion preferably includes a base frame having a plate shape that extends horizontally, one or more linear rails provided on the base frame to extend horizontally along the base frame, guide members which are guided along and supported by the one or more linear rails, connecting members each of which connects corresponding one of the transported article support portions to corresponding one of the guide members, wherein each of the connecting member preferably has a shoulder portion which is connected to the corresponding one of the guide members and which extends horizontally, an upper arm portion which is bent downward from the shoulder portion and connected to the corresponding one of the transported article support portions, wherein the vertically movable member is preferably formed to have a box shape which contains at least a portion of the guiding supporting portion, wherein each of the transported article support portions preferably projects downwardly from a hole formed in a bottom face portion of the box-shaped vertically movable member, and wherein the receiving portion is preferably provided to the bottom face portion of the vertically movable member, and the received portion is preferably provided to the base frame.

With the arrangement described above, the damper element is provided in a compressed state between the receiving portion of the vertically movable portion and the received portion of the guiding supporting portion. As such, since the strength by which the damper element is attached to the receiving portion or to the received portion can be less compared with the case where the damper element is provided in an expanded state between the receiving portion of the vertically movable portion and the received portions of the guiding supporting portion, which makes it easier to install the damper element.

And the receiving portion is preferably removably provided to the vertically movable portion.

With the arrangement described above, by removing the receiving portion from the vertically movable portion, the area below the damper element can be opened, or the damper element can be removed together with the receiving portion that is being removed, which facilitates maintenance work on the damper element, such as replacing the damper element, etc.

What is claimed is:
1. An article transport vehicle comprising:
a travel member configured to travel along a travel path;

a support unit for suspending and supporting a transported article;

a vertical movement actuator for vertically moving the support unit relative to the travel member;

wherein the support unit includes a vertically movable portion which is vertically moved by the vertical movement actuator, transported article support portions for supporting a supported portion of the transported article, one or more support actuators for moving the transported article support portions between support positions and retracted positions, and further comprising a horizontal restriction member which restricts two opposite movements of the guiding supporting portion relative to the vertically movable portion, wherein the support positions are positions in which the transported article support portions are located directly below the supported portion, and the retracted positions are positions in which the transported article support portions are retracted from directly below the supported portion, wherein the support unit further includes the guiding supporting portion that supports the transported article support portions and movably guides the transported article support portions to the support positions and to the retracted positions, a horizontal restriction member which restricts two opposite movements of the guiding supporting portion relative to the vertically movable portion, and a damper element which is disposed between the vertically movable portion and the guiding supporting portion and receives load from the guiding supporting portion including load from the transported article support portions, and which is elastically deformable in a vertical direction, wherein the vertically movable portion is provided with a receiving portion which receives and supports the damper element, wherein the guiding supporting portion is provided with a received portion which is located above the receiving portion and is received and supported by the damper element, wherein the transported article support portions are located below the vertically movable portion, and wherein two horizontal restriction members are disposed between two damper elements.

2. The article transport vehicle as defined in claim 1, wherein the guiding supporting portion includes a base frame having a plate shape that extends horizontally, one or more linear rails provided on the base frame to extend horizontally along the base frame, guide members which are guided along and supported by the one or more linear rails, connecting members each of which connects corresponding one of the transported article support portions to corresponding one of the guide members, wherein each of the connecting members has a shoulder portion which is connected to the corresponding one of the guide members and which extends horizontally, an upper arm portion which is bent downward from the shoulder portion and connected to the corresponding one of the transported article support portions, wherein a vertically movable member is formed to have a box shape which contains at least a portion of the guiding supporting portion, wherein each of the transported article support portions projects downwardly from a hole formed in a bottom face portion of the box-shaped vertically movable member, and wherein the receiving portion is provided to the bottom face portion of the vertically movable member, and the received portion is provided to the base frame.

3. The article transport vehicle as defined in claim 2, wherein the receiving portion is removably provided to the vertically movable portion.

4. The article transport vehicle as defined in claim 1, wherein the receiving portion is removably provided to the vertically movable portion.

5. The article transport vehicle as defined in claim 1, wherein the vertically movable portion is provided with a receiving portion which receives and supports the damper element, wherein the transported article support portions are located below the vertically movable portion.

6. The article transport vehicle as defined in claim 5, wherein the guiding supporting portion includes a base frame having a plate shape that extends horizontally, one or more linear rails provided on the base frame to extend horizontally along the base frame, guide members which are guided along and supported by the one or more linear rails, connecting members each of which connects corresponding one of the transported article support portions to corresponding one of the guide members, wherein each of the connecting member-members has a shoulder portion which is connected to the corresponding one of the guide members and which extends horizontally, an upper arm portion which is bent downward from the shoulder portion and connected to the corresponding one of the transported article support portions, wherein a vertically movable member is formed to have a box shape which contains at least a portion of the guiding supporting portion, wherein each of the transported article support portions projects downwardly from a hole formed in a bottom face portion of the box-shaped vertically movable member, and wherein the receiving portion is provided to the bottom face portion of the vertically movable member, and the received portion is provided to the base frame.

7. The article transport vehicle as defined in claim 6, wherein the receiving portion is removably provided to the vertically movable portion.

8. The article transport vehicle as defined in claim 5, wherein the receiving portion is removably provided to the vertically movable portion.

* * * * *

UNITED STATES PATENT AND TRADEMARK OFFICE
CERTIFICATE OF CORRECTION

PATENT NO.        : 9,576,832 B2
APPLICATION NO.   : 14/937039
DATED             : February 21, 2017
INVENTOR(S)       : Daichi Tomida It is certified that error appears in the above-identified patent and that said Letters Patent is hereby corrected as shown below:

In the Claims

Column 12, Lines 20-23, Claim 5, after "claim 1," delete "wherein the vertically movable portion is provided with a receiving portion which receives and supports the damper element,"

Column 12, Line 24, Claim 5, before "wherein" insert -- wherein the guiding supporting portion is provided with a received portion which is located above the receiving portion and is received and supported by the damper element, and --

Column 12, Line 37, Claim 6, after "connecting" delete "member-"

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*